(12) United States Patent
Randolph et al.

(10) Patent No.: US 9,334,568 B2
(45) Date of Patent: *May 10, 2016

(54) BEAM-INDUCED DEPOSITION OF LOW-RESISTIVITY MATERIAL

(71) Applicant: FEI Company, Hillsboro, OR (US)

(72) Inventors: Steven Randolph, Portland, OR (US); Clive D. Chandler, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/799,397

(22) Filed: Jul. 14, 2015

(65) Prior Publication Data

US 2016/0010211 A1    Jan. 14, 2016

Related U.S. Application Data

(63) Continuation of application No. 13/351,088, filed on Jan. 16, 2012, now Pat. No. 9,090,973.

(60) Provisional application No. 61/438,144, filed on Jan. 31, 2011.

(51) Int. Cl.
*H05H 1/24* (2006.01)
*C23C 16/48* (2006.01)
*C23C 16/18* (2006.01)
(Continued)

(52) U.S. Cl.
CPC .............. *C23C 16/486* (2013.01); *C23C 16/18* (2013.01); *H01L 21/28556* (2013.01); *H01L 21/76877* (2013.01)

(58) Field of Classification Search
CPC ....... C23C 8/00; C23C 16/047; C23C 16/407; H01L 21/76895; H01J 37/317; H01J 2237/31732
USPC ........................................................ 427/531
See application file for complete search history.

(56) References Cited

U.S. PATENT DOCUMENTS

| 4,239,788 A | 12/1980 | Beck |
| 4,548,864 A * | 10/1985 | Nakayama ............... G11B 5/64 |
| | | 428/336 |
| 4,908,226 A * | 3/1990 | Kubena ................. C23C 16/047 |
| | | 219/121.35 |

(Continued)

FOREIGN PATENT DOCUMENTS

| WO | 9738355 | 10/1997 |
| WO | 2008098084 | 8/2008 |

OTHER PUBLICATIONS

A. Botman et al., "Creating Pure Nanostructures from Electron-Beam-Induced Deposition Using Purification Techniques: A Technology Perspective", Nanotechnology, Aug. 26, 2009, 17 pages.

(Continued)

*Primary Examiner* — Dah-Wei D Yuan
*Assistant Examiner* — Kristen A Dagenais
(74) *Attorney, Agent, or Firm* — Scheinberg & Associates, P.C.; Michael O. Scheinberg

(57) ABSTRACT

An improved method of beam deposition to deposit a low-resistivity metal. Preferred embodiments of the present invention use a novel focused ion beam induced deposition precursor to deposit low-resistivity metallic material such as tin. Applicants have discovered that by using a methylated or ethylated metal such as hexamethylditin as a precursor, material can be deposited having a resistivity as low as 40 μΩ·cm.

21 Claims, 7 Drawing Sheets

(51) Int. Cl.
*H01L 21/285* (2006.01)
*H01L 21/768* (2006.01)

(56) References Cited

U.S. PATENT DOCUMENTS

| | | | |
|---|---|---|---|
| 5,104,684 A | 4/1992 | Tao et al. | |
| 5,594,245 A | 1/1997 | Todokoro et al. | |
| 5,827,786 A * | 10/1998 | Puretz | C23C 16/047 250/492.21 |
| 6,200,649 B1 | 3/2001 | Dearnaley | |
| 6,399,944 B1 | 6/2002 | Vasilyec et al. | |
| 6,492,261 B2 * | 12/2002 | Gavish | C23C 16/047 257/E21.168 |
| 6,638,580 B2 * | 10/2003 | Gavish | C23C 16/047 257/E21.169 |
| 7,504,182 B2 | 3/2009 | Stewart et al. | |
| 7,674,706 B2 | 3/2010 | Gu et al. | |
| 2006/0045987 A1 | 3/2006 | Chandler et al. | |
| 2008/0142735 A1 | 6/2008 | Chandler et al. | |
| 2010/0032567 A1 | 2/2010 | Botman et al. | |
| 2010/0197142 A1 | 8/2010 | Randolph et al. | |
| 2010/0224592 A1 | 9/2010 | Toth et al. | |
| 2011/0031655 A1 | 2/2011 | Toth et al. | |
| 2011/0070381 A1 | 3/2011 | Toth et al. | |
| 2011/0114665 A1 | 5/2011 | Chandler et al. | |
| 2011/0115129 A1 | 5/2011 | Straw et al. | |
| 2011/0210181 A1 | 9/2011 | Edinger et al. | |
| 2012/0003394 A1 | 1/2012 | Mulders et al. | |

OTHER PUBLICATIONS

W.F. Van Dorp et al., "A Critical Literature Review of Focused Electron Beam Induced Deposition," Journal of Applied Physics, 2008, 42 pages.

Albert Folch et al., "Electron Beam Deposition of Gold Nanostructures in a Reactive Environment," Appl. Phys. Lett., Apr. 17, 1995, 3 pages.

Kristian Molhave et al., "Solid Gold Nanostructures Fabricated by Electron Beam Deposition", Nanoletters, Oct. 1, 2003, 5 pages.

S.J. Randolph et al., "Focused, Nanoscale Electron-Beam-Induced Deposition and Etching", Critical Reviews in Solid State and Materials Sciences, 2006, 35 pages.

Cyril Thurier et al., "Platinum OMCVD Processes and Precursor Chemistry", Apr. 8, 2007, 15 pages.

Shinji Matsui et al., "New Selective Deposition Technology by Electron Beam Induced Surface Reaction", Japanese Journal of Applied Physics, Sep. 1984, 3 pages.

M. Tanaka et al., "The Size Dependence of the Nano-dots Formed by Electron-Beam-Induced Deposition on the Partial Pressure of the Precursor", Applied Physics A, Nov. 21, 2003, 4 pages.

T. Yasuda et al., "Chemical Vapor Deposition of Si on Chlorosilane-treated SiO2 Surface. II. Selective Deposition in the Regions Defined by Electron-Beam Irradiation", J. Appl. Phys. 2001, Oct. 15, 2001, 8 pages.

Kenti Gamo et al., "Characteristics of Selective Deposition of Metal Organic Films Using Focused Ion Beams", Extended Abstracts of the 16th (1984 International) Conference on Solid State Devices and Materials, Aug. 30-Sep. 1, 1984, 4 pages.

R>M> Langford et al., "Reducing the Resistivity of Electron and Ion Beam Assisted Deposited Pt", Microelectronic Engineering, Jan. 27, 2007, 5 pages.

Ivo Utke et al., "Gas-assisted Focused Electron Beam and Ion Beam Processing and Fabrication", Journal of Vacuum Science and Technology B, Aug. 11, 2008, 80 pages.

Anne Marie Helmenstine, "Table of Electrical Resistivity and Conductivity", <http://chemistry.about.com/od/moleculescompounds/a/Table-of-electrical-resistivity-and-conductivity.htm>.

* cited by examiner

US 9,334,568 B2

BEAM-INDUCED DEPOSITION OF LOW-RESISTIVITY MATERIAL

This application is a continuation of U.S. application Ser. No. 13/351,088, filed Jan. 16, 2012, which claims priority from U.S. Provisional App. 61/438,144, filed Jan. 31, 2011, both of which are hereby incorporated by reference.

TECHNICAL FIELD OF THE INVENTION

The invention relates to electron and ion beam induced deposition, and more particularly to beam-induced deposition of metallic tin, tin oxides, and/or tin nitrides.

BACKGROUND OF THE INVENTION

In the prior art, it is known to deposit a material onto a substrate via electron beam induced deposition (EBID) and ion beam induced deposition (IBID). According to the known method, a substrate is placed in the evacuable specimen chamber of a charged particle beam apparatus—typically either an electron beam (E-beam) system or a focused ion beam (FIB) system. The charged particle (or other) beam is applied to the substrate surface in the presence of a deposition gas, often referred to as a precursor gas. A layer of the precursor gas adsorbs to the surface of the work piece. The thickness of the layer is governed by the balance of adsorption and desorption of the gas molecules on the substrate surface, which in turn depends on, for example, the partial gas pressure (determining how many molecules are adsorbed per second), and the sticking coefficient (describing how long, on average, a molecule is adsorbed to the surface). The resultant layer is typically formed of one or several mono-atomic layers.

When the charged particle beam irradiates the substrate with the adsorbed layer of precursor gas, secondary electrons are emitted from the substrate. These secondary electrons as well as primary and backscattered electrons cause a dissociation of the adsorbed precursor gas molecules. Part of the dissociated precursor material forms a deposit on the substrate surface, while the rest of the precursor gas particle forms a volatile by-product and is pumped away by the vacuum system of the apparatus.

Beam induced deposition (BID) is used in a wide variety of applications for depositing a material onto a target surface of a substrate such as a semiconductor wafer or magnetic storage media. The materials are deposited for a variety of reasons such as to form thin-film surfaces, electrical connections, protective coatings for semiconductor feature characterization and analysis, or to "weld" small samples, such as TEM samples, to a manipulator or sample holder (as described in more detail below). Many combinations of gasses, substrates, and beam types can be used to achieve a variety of deposition schemes. The particular material to be deposited will usually depend on the application, underlying target surface, and how the material reacts with the beam or surface. Similarly, a variety of beam types can be used to generate secondary electrons, secondary ions, photons, phonons, plasmons, etc. These include ion, electron, and laser beams.

A disadvantage of known beam induced deposition methods is that while there are a wide variety of metals, semiconductors, and dielectrics that may be deposited using beam-induced techniques; the purity and material properties of BIDs are almost always much poorer than the bulk properties. This is widely documented in the prior art. One of the more common deposition material properties of concern is the metallic resistivity of deposits. Depending on the precursor and material deposited as well as the type of beam, resistivity values typically range from 10 to more than 1,000 times greater than the bulk metallic resistivity.

This increased resistivity of conductive materials deposited via BID is of special concern for circuit edit (CE) applications. Performing circuit edit using a FIB on an integrated circuit (IC) is essential for design debug and failure analysis. Today's high-frequency IC devices require very low interconnect resistivity for increased chip performance; resistivity on the order of 50 $\mu\Omega\cdot$cm is highly desirable to reduce any performance bottleneck resulting from on-chip interconnect delay. Application of the FIB circuit edits to validate performance of an IC device will be more effective if the resistivity of the edit closely approximates the values of the fabricated line. Using typical prior art methods, the lowest resistivity for a conductor deposited via IBID is tungsten having a resistivity value of ~200 $\mu\Omega\cdot$cm, which is significantly greater than the desired 50 $\mu\Omega\cdot$cm resistivity for IC interconnects.

Accordingly, there is a need for an improved method of beam-induced deposition that provides for deposition of a conductor via BID having a lower resistivity—preferably a resistivity on the order of 50 $\mu\Omega\cdot$cm—than conductors deposited via prior art methods.

SUMMARY OF THE INVENTION

An object of the invention is to provide an improved method of beam deposition. Preferred embodiments of the present invention address and solve this problem by using a novel focused ion beam induced deposition (FIBID) precursor to deposit low-resistivity metallic material such as tin. Applicants have discovered that by using a methylated or ethylated metal such as hexamethylditin (HMDT) as a precursor, material can be deposited having a resistivity as low as 40 $\mu\Omega\cdot$cm.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

As will be appreciated by anyone of skill in the art, identification of suitable precursors for material deposition is often extremely difficult. There are a large number of competing factors and tradeoffs that must be considered. One must select a precursor with significant vapor pressure, stability, and lifetime to be capable of producing deposits in a reproducible manner over an extended period of time. Preferably the precursor will have a low affinity for oxidation as this impairs resistivity. However, compounds that resist oxidation such as noble metal compounds are most frequently highly reactive, unstable, and difficult if not impossible to synthesize. Organometallics may be very stable and relatively easy to synthesize, but have a high amount of carbon, which greatly impairs purity and material properties of the resultant deposit due to incorporation of carbonaceous ligand material into the metal feature. Metal halides avoid carbon problems and may be volatile, but may actually enhance etching with a FIB and/or not deposit at all.

Hexamethylditin (HMDT) is an organotin compound having the molecular formula $C_6H_{18}Sn_2$ that is commonly used in organic synthesis reactions and has a melting point of 23° C. and has significant vapor pressure at room temperature to robustly deliver precursor in sufficient quantities for BID. When HMDT is used as an electron beam precursor in EBID, the resultant deposition is likely a mixture of tin oxide and carbon. The resistivity of this material is poor and has non-ohmic (non-linear current/voltage response) electrical properties. These properties are not desirable for circuit edit where low resistivity is required. However, tin oxides and nitrides can behave as semiconductors and, as such, have application in other fields.

Figure 1:
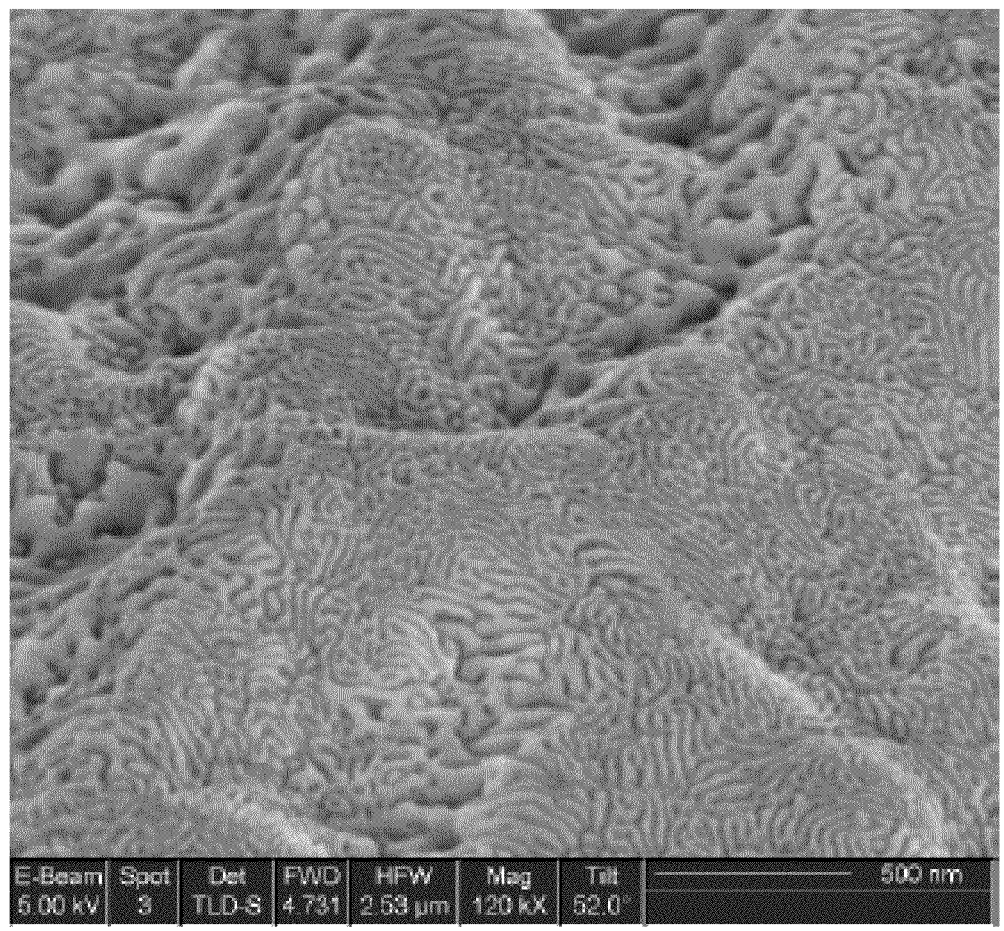
FIG. 1 is a SEM photomicrograph showing deposition of a microstructure with focused ion beam induced deposition utilizing HMDT as a precursor.
Figure 2:
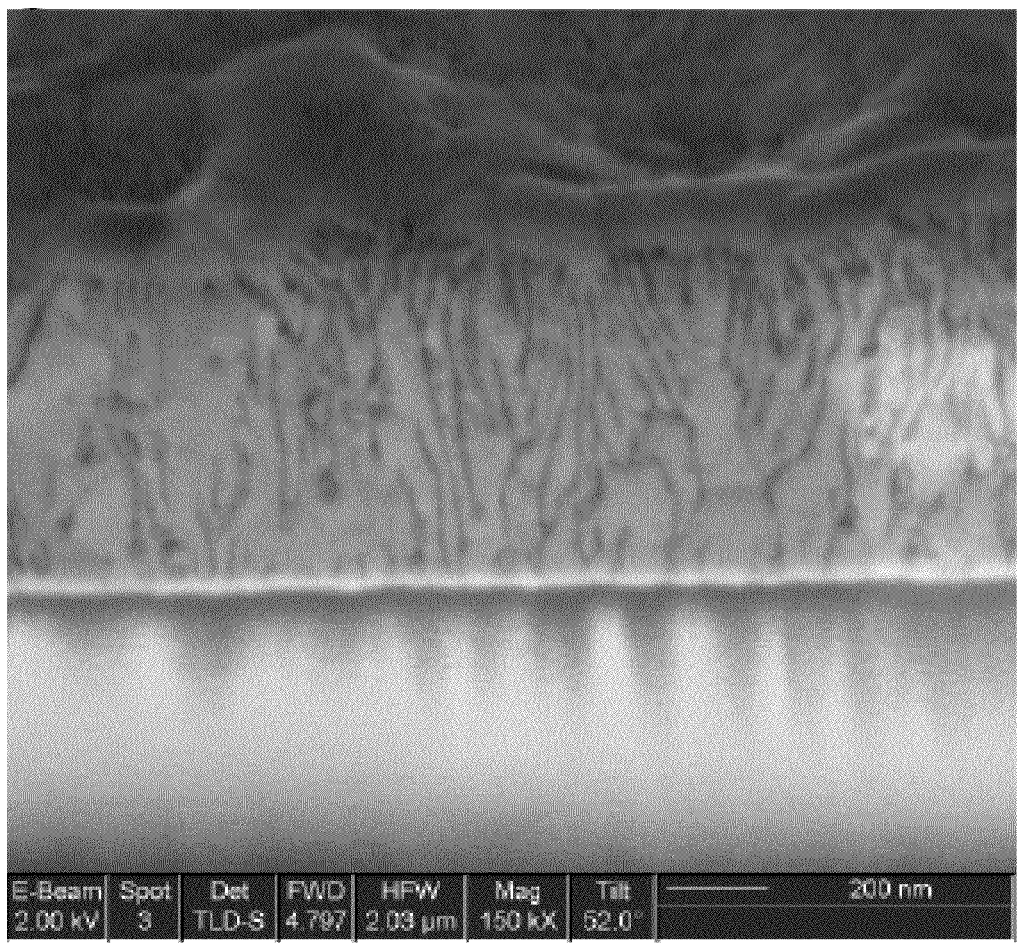
FIG. 2 is another SEM photomicrograph showing deposition of a microstructure with focused ion beam induced deposition utilizing HMDT as a precursor.

Applicants have discovered, however, that deposition using a methylated or ethylated metal such as HMDT with a gallium ion beam and the resulting incorporation of gallium into the deposit results in material that is Ohmic (linear current/voltage response) and of excellent resistivity (within a factor of 5 of bulk tin). Tin and gallium, deposited by an ion beam, may form solid solutions and eutectic mixtures, which may provide an additional boost to the measured resistivity. Some of the morphologies exhibited in the deposits are reminiscent of some eutectic solidification reactions, but this has not been confirmed. FIGS. 1 and 2 show examples of microstructures that can manifest in FIBID with HMDT.

Figure 3:
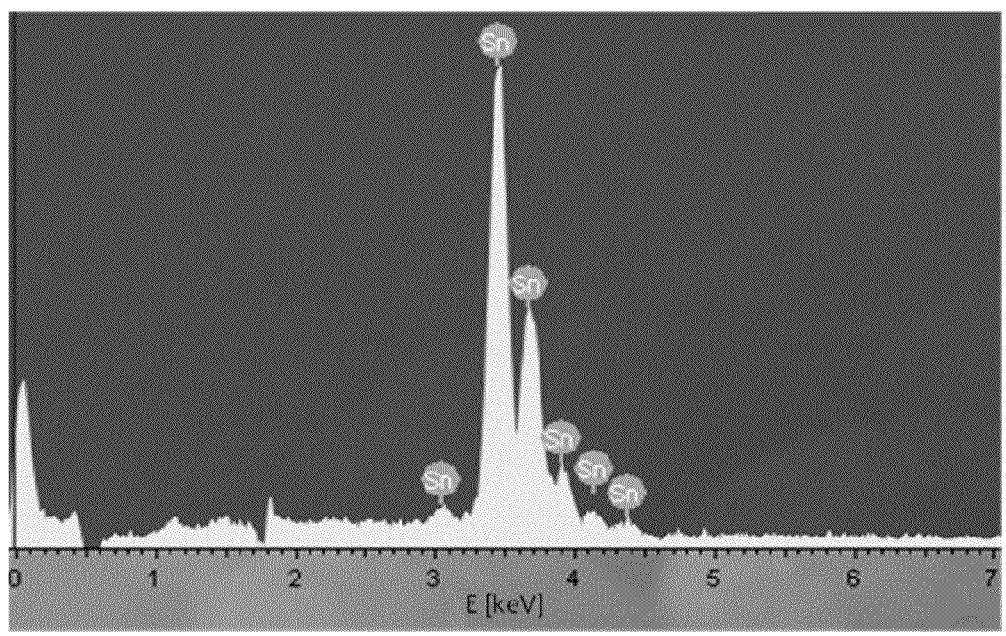
FIG. 3 is an EDS spectrum of a FIBID deposit that indicates approximately 97% purity tin with balance being gallium and small amounts of carbon and oxygen.

Regardless of the exact mechanism of deposition, the novel use of HMDT for FIBID has been empirically shown to produce deposited material with excellent electrical properties with a high level of purity (approaching 100% tin). FIG. 3 is an EDS spectrum of a FIBID deposit using HMDT as the precursor, which indicates approximately 97% purity tin with the balance being gallium and small amounts of carbon and oxygen. For clarity, background spectra of $SiO_2$ has been subtracted in FIG. 3. Preferably, material deposited according to the present invention will have a purity of at least 90% for the metal dissociated from the precursor gas; more preferably, the deposited material will have a purity of at least 95% for the dissociated metal.

Figure 4A:
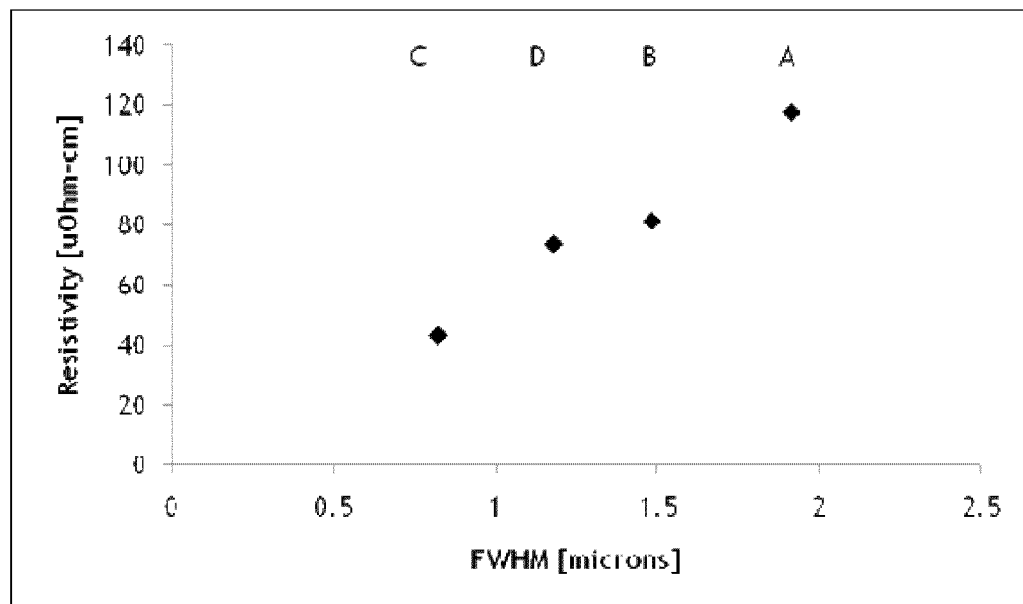
FIG. 4A is a graph displaying the measured electrical resistivity of different deposits FIBID deposit using HMDT as the precursor as a function of the full width-half maximum of each deposit (an indirect metric of current density)
Figure 4B:
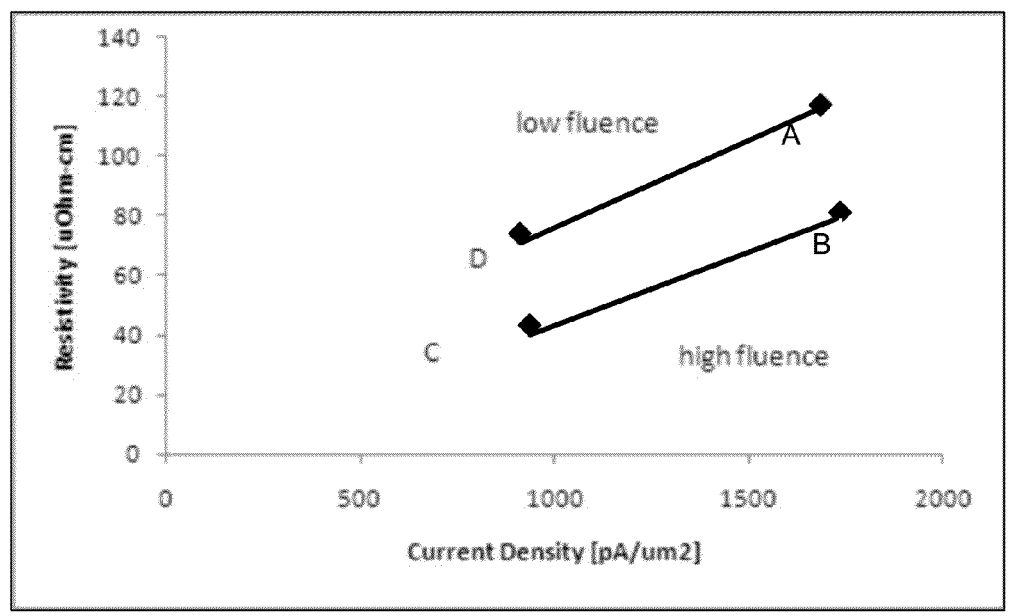
FIG. 4B is a graph that shows the calculation of current density for different deposits based upon measured electrical resistivity.

FIG. 4A is a plot displaying the measured electrical resistivity of different FIBID deposits using a precursor of HMDT as a function of the full width-half maximum of each deposit (an indirect metric of current density). Here, different beam currents have been used to deposit metallic lines. In FIG. 4A, the plot shows the beam current increasing (from left to right) while the beam diameter also increases by some unknown amount. The full width-half maximum of the deposit can be expected to have a correlation with the actual beam diameter, and this correlation can be used to estimate a current density. FIG. 4B is a plot displaying calculated current density for different deposits based upon measured electrical resistivity. Given that increased fluence decreases resistivity, and increased current density decreases resistivity, the lowest resistivity should be obtained by maximizing both current density and fluence.

As shown in FIGS. 4A and 4B, Applicants have discovered that by using a methylated or ethylated metal such as HMDT as a precursor, a very low-resistivity material can be deposited. As the term is used herein, "low resistivity" will be used to refer to resistivity less than 120 µΩ·cm. For the lowest resistivity deposition, current density (ions per unit area per unit time) should be maximized, as should be the fluence (ions per unit area). As shown in FIGS. 4A and 4B, using the HMDT precursor, tin can be deposited having a resistivity as low as 40 µΩ·cm. In this case, tin having a resistivity of approximately 40 µΩ·cm was deposited using a 500 pA beam at 30 kV, with negative beam overlaps used to deposit a 30 micron long line for 20 seconds. In addition to HMDT, other methylated and ethylated metals might also be used in some circumstances to deposit low-resistivity material, including for example methyl tin trichlorides and hexaethyl and hexabutyl ditins.

Figure 5A:
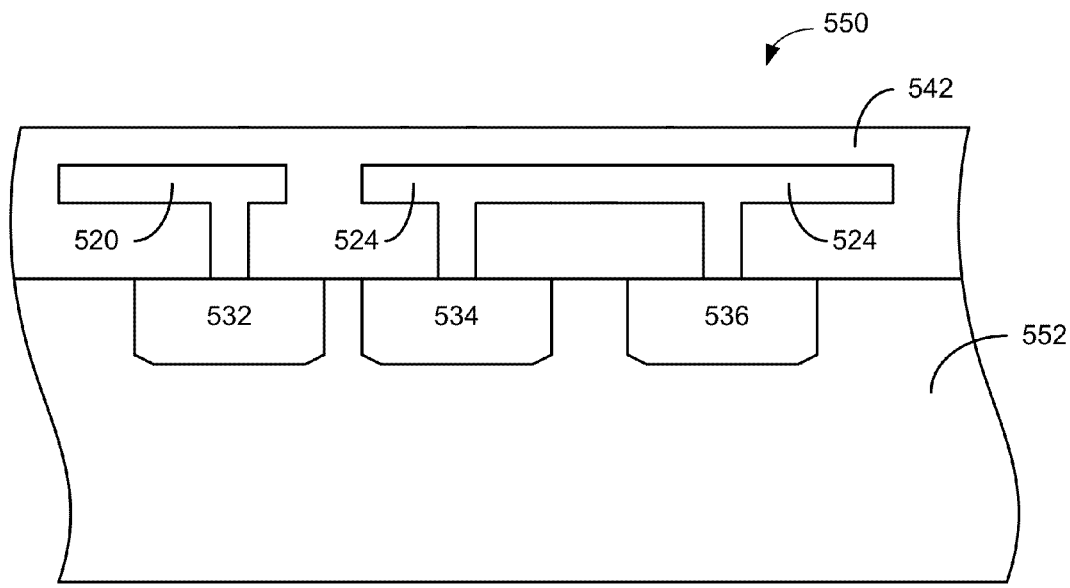
FIG. 5A is a cross sectional view showing schematically a portion of a typical integrated circuit.

Embodiments of the present invention are thus suitable for use in depositing conductive material during circuit edit. For example, FIG. 5A is a cross sectional view showing schematically a portion of a typical integrated circuit 550. As shown in FIG. 5A, integrated circuit 550 includes substrate 552 and dielectric isolation layer 542. Metal interconnects 520 and 524 are coupled to diffusion regions 532, 534, and 536. Diffusion region 534 is coupled to diffusion region 536 through metal interconnect 524; and diffusion region 532 is not coupled to diffusion region 534.

Figure 5B:
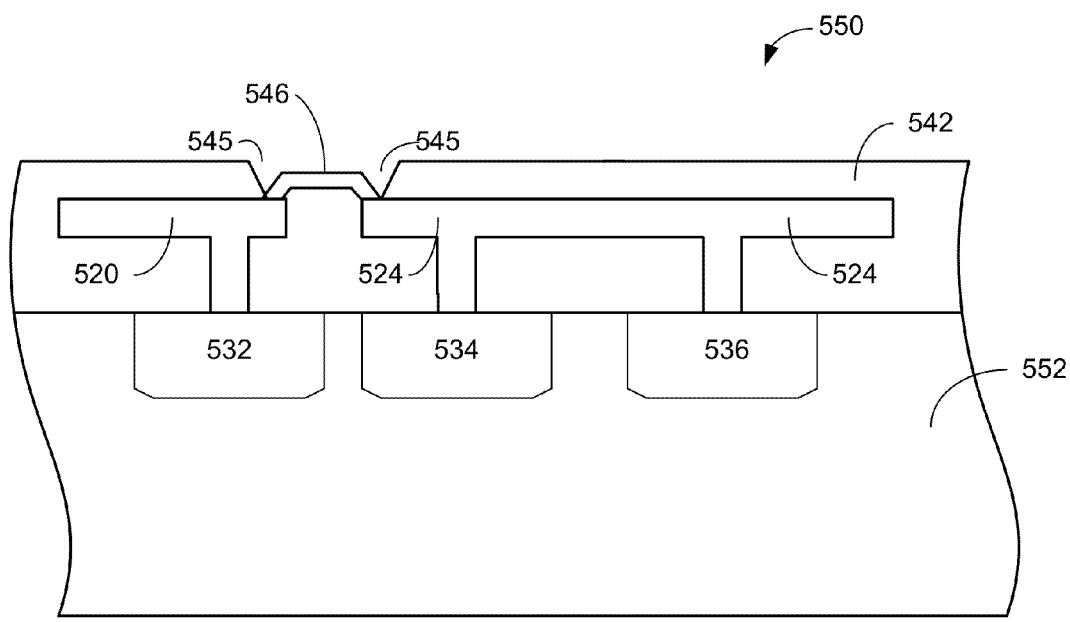
FIG. 5B is a cross sectional view showing a circuit edit performed on the integrated circuit of FIG. 5A.

FIG. 5B is a cross sectional view showing a circuit edit performed on an integrated circuit 550 of FIG. 5A. Integrated circuit 550 includes substrate 552 and dielectric isolation layer 542. Metal interconnects 520 and 524 are coupled to diffusion regions 532, 534 and 536. As shown in FIG. 5B, circuit edits have also been performed to connect diffusion region 532 to diffusion region 534. Hole 545 has been milled through dielectric isolation layer 542 to expose a portion of metal interconnect 522 and of metal interconnect 524. A conductor 546 has then been deposited to connect metal interconnect 522 to metal interconnect 524, thereby connecting diffusion region 532 to diffusion region 534. As discussed above, high frequency IC devices require very low interconnect resistivity for increased chip performance; resistivity on the order of 50 μΩ·cm is highly desirable to reduce any performance bottle-neck resulting from on-chip interconnect delay. Application of the FIB circuit edits to validate performance of an IC device will be more effective if the resistivity of the edit closely approximates the values of the fabricated line.

Figure 6:
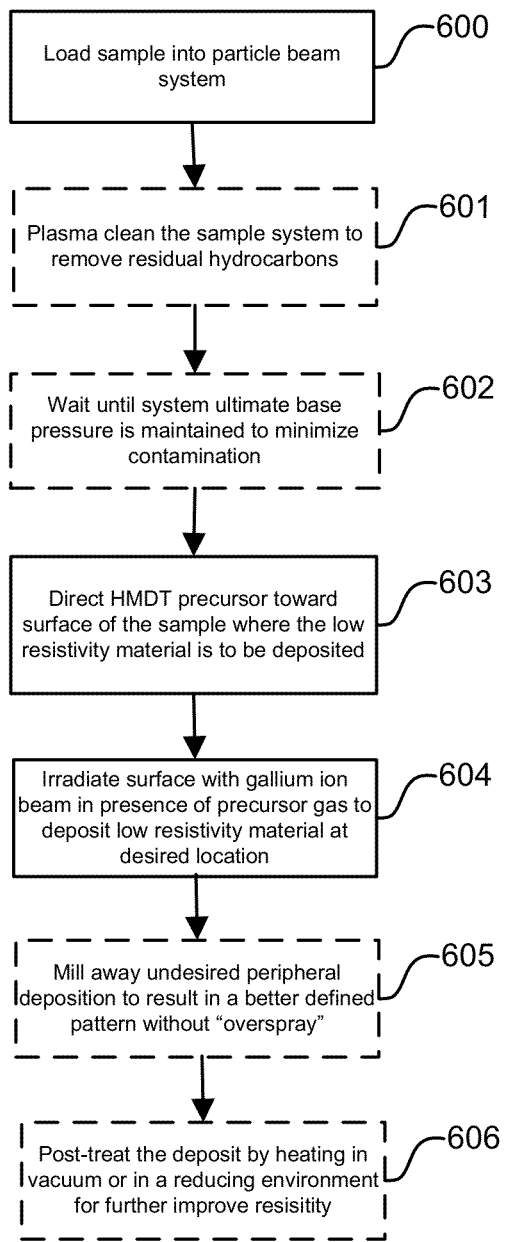
FIG. 6 is a flow chart showing the steps for carrying out a method of depositing a layer of tin using HMDT as a precursor according to a preferred embodiment of the present invention.

FIG. 6 is a flow chart showing the steps for carrying out a method of depositing a layer of tin using HMDT as a precursor according to a preferred embodiment of the present invention. In step 600, a sample is loaded into a suitable particle beam system. Persons of skill in the art will appreciate that the particle beam system will depend upon the particular application for the deposited material. A suitable particle beam system for preparing the TEM sample could be, for example, a dual beam SEM/FIB system such as the one described below with reference to FIG. 7. In step 601, an optional plasma cleaning step can be used to remove residual hydrocarbons in order to minimize potential for deposit contamination. In optional step 602, deposition is delayed until system ultimate base pressure is reached by the vacuum system in order to minimize contamination, for example from volatile hydrocarbons or other residual contaminants.

In step 603, a precursor gas comprising a methylated or ethylated metal such as HMDT is directed at the surface of the sample where the material is to be deposited. Preferably, the precursor gas is directed at the surface through a gas-delivery needle or capillary to produce a local gas pressure in the mbar range. In one preferred embodiment, the vacuum pressure without the precursor gas would be approximately $3 \times 10^{-6}$ mbar, and with the precursor gas the pressure in the vacuum chamber would rise to approximately $5 \times 10^{-5}$ mbar. As would be recognized by a person of sill in the art, any appreciable pressure increase over the base pressure of the system could be sufficient to do gas chemistry, but it is desirable that the pressure increase be limited to minimize system exposure and not to exceed system vacuum constraints. In general it is not necessary to heat the precursor more than a few degrees above the system temperature to achieve substantial pressures. In fact, flow reducing apertures may actually be employed to allow working at lower gas pressures to minimize load on the microscope.

Then in step 604 the focused ion beam is used to irradiate the surface wherever the precipitate material is to be deposited. The rate of local material deposition can be varied, but in preferred embodiments could be approximately 6 μm³/min. In preferred embodiments, a gallium ion beam is used. The present invention could also be practiced using a plasma source FIB where the ion can be chosen, for example, using xenon, argon, or helium ions. Also a mass-selected FIB source capable of delivering a wide array of ions of varying charge, as well as dimers/trimers, and their respective ions would also be suitable for inducing the beam chemistry according to the present invention. Additionally, reactive plasma source generated or atomic oxygen beams could be used to perform deposition of tin oxides, for example.

In optional step 605, after deposition, the ion beam can be used to mill away undesired peripheral deposition to result in a better defined pattern without overspray. Finally, in optional step 606, the deposited material can be treated by heating in a vacuum or in a reducing environment to further improve (lower) resistivity. In the case of annealing at temperatures approaching the melting point of the metal for minutes to hours, enhanced thermal motion allows for reordering and crystallization of the metal. This typically has the effect of reducing the resistivity of metals by reducing the number of scattering defects that may inhibit electron motion. In the case of reducing environments, the goal is to combat oxidation of the tin metal, which may occur due to residual chamber gases during deposition. For instance, commercial atomic hydrogen generators may be used to bombard the oxidized metal with highly reactive atomic hydrogen. This reaction can result in the reduction of tin from its oxidized form to a zero oxidation state, which is more favorable to electron transport (lowering the resistivity). Alternatively, the resistivity of the deposited material can be improved by annealing the material via an ion beam, electron beam, laser, or electrically by passing current through the metal.

In other preferred embodiments of the present invention, the tin precursor can be mixed with Oxygen or water to form tin oxides or mixed with an amine or nitrogen containing compound to form tin nitrides. In this way, different materials can be deposited using the same tin precursor, with the deposited material capable of acting as a conductor, an insulator, or as a semiconductor, depending upon the compound mixed with the precursor. The resistivity of the deposited material can be easily controlled depending upon the desired use, thus greatly expanding the utility of the tin deposition process.

Figure 7:
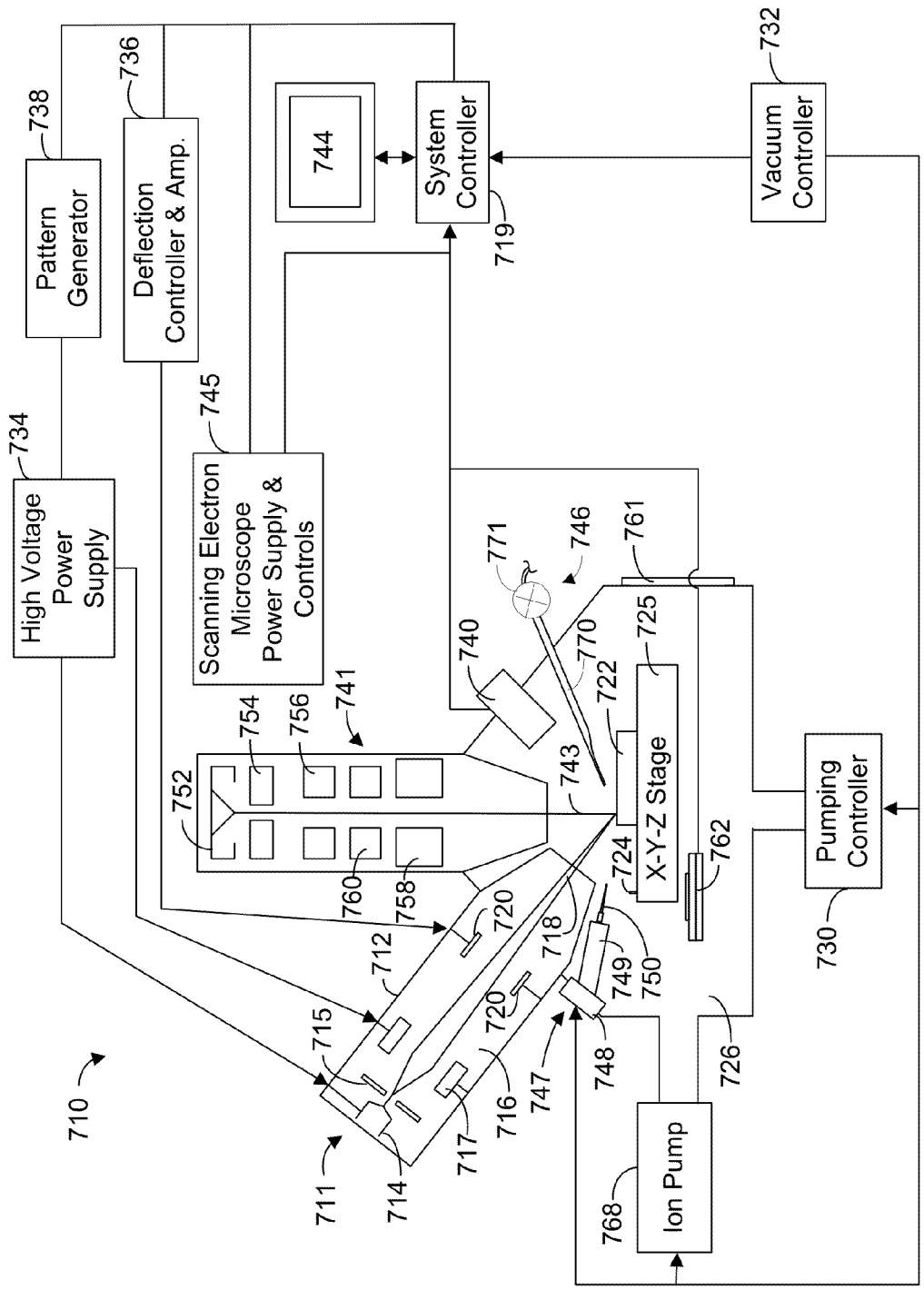
FIG. 7 depicts one embodiment of an exemplary dual beam SEM/FIB system that is equipped to carry out a method according to the present invention.

FIG. 7 depicts one embodiment of an exemplary dual beam SEM/FIB system 710 that is equipped to carry out a method according to the present invention. Embodiments of the present invention can be used in a wide variety of applications where a low resistivity material is deposited onto a target surface of a substrate. Preparation and analysis of such a sample is typically performed in a dual beam electron beam/focused ion beam system such as the one now described. Suitable dual beam systems are commercially available, for example, from FEI Company, Hillsboro, Oreg., the assignee of the present application. While an example of suitable hardware is provided below, the invention is not limited to being implemented in any particular type of hardware.

Dual beam system 710 has a vertically mounted electron beam column and a focused ion beam (FIB) column mounted at an angle of approximately 52 degrees from the vertical on an evacuable specimen chamber 726. The specimen chamber may be evacuated by e.g. a turbomolecular pump, or other known pumping means such as oil diffusion pumps, ion getter pumps, scroll pumps, etc.

The electron beam column 741 comprises an electron source 752 for producing electrons and electron-optical lenses 756, 758 forming a finely focused beam of electrons 743. The beam of electrons 743 can be positioned on and can be scanned over the surface of a substrate 722 by means of a deflection coil 760. Operation of lenses 756, 758 and deflection coil 760 is controlled by power supply and control unit 745. It is noted that lenses and deflection unit may use electric fields to manipulate the electron beam, or that magnetic fields may be used, or a combination thereof.

Electron beam 743 can be focused onto substrate 722, which is on movable X-Y-Z stage 725 within lower chamber 726. When the electrons in the electron beam strike substrate 722, secondary electrons are emitted. These secondary electrons are detected by secondary electron detector 740, such as an Everhard-Thornley detector, or a semiconductor device capable of detecting low energy electrons. The signal of the detector is fed to a controller 719. Said controller also controls the deflector signals, lenses, electron source, GIS, stage and pump, and other items of the instrument. Monitor 744 is used to display an image of the substrate using the signal of the detector 719. STEM detector 762, located beneath the TEM sample holder 724 and the stage 725, can collect electrons that are transmitted through a sample mounted on the TEM sample holder.

Mounted on the vacuum chamber is a Gas Injection System (GIS) 746. The GIS comprises a reservoir (not shown) for holding the precursor material and a needle 770 for directing the HMDT precursor material to the surface of the substrate. The GIS further comprises means 771 for regulating the supply of precursor material to the substrate. In this example the regulating means are depicted as an adjustable valve, but the regulating means may also take the form of e.g. controlled heating of the precursor material.

Dual beam system 710 also includes focused ion beam (FIB) system 711 which comprises an evacuated chamber having an upper neck portion 712 within which are located an ion source 714 and a focusing column 716 including extractor electrodes and an electrostatic optical system. The axis of focusing column 716 is tilted 52 degrees from the axis of the electron column. The ion column 712 includes an ion source 714, an extraction electrode 715, a focusing element 717, deflection elements 720, and a focused ion beam 718. Ion beam 718 passes from ion source 714 through column 716 and between electrostatic deflection means schematically indicated at 720 toward substrate 722, which comprises, for example, a semiconductor device positioned on movable X-Y-Z stage 725 within lower chamber 726.

Stage 725 can also support one or more TEM sample holders 724 so that a sample can be extracted from the semiconductor device and moved to a TEM sample holder. Stage 725 can preferably move in a horizontal plane (X and Y axes) and vertically (Z axis). Stage 725 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 761 is opened for inserting substrate 722 onto X-Y-Z stage 725 and also for servicing an internal gas supply reservoir, if one is used. The door is interlocked so that it cannot be opened if the system is under vacuum.

An ion pump 768 is employed for evacuating neck portion 712. The chamber 726 is evacuated with turbomolecular and mechanical pumping system 730 under the control of vacuum controller 732. The vacuum system provides within chamber 726 a vacuum of approximately $3 \times 10^{-6}$ mbar. When a suitable precursor gas is introduced onto the sample surface, the chamber background pressure may rise, typically to less than about $5 \times 10^{-5}$ mbar.

High voltage power supply 734 is connected to liquid metal ion source 714 as well as to appropriate electrodes in ion beam focusing column 716 for forming an approximately 1 keV to 60 keV ion beam 718 and directing the same toward a sample. Deflection controller and amplifier 736, operated in accordance with a prescribed pattern provided by pattern generator 738, is coupled to deflection plates 720 whereby ion beam 718 may be controlled manually or automatically to trace out a corresponding pattern on the upper surface of substrate 722. In some systems the deflection plates are placed before the final lens, as is well known in the art. Beam blanking electrodes (not shown) within ion beam focusing column 716 cause ion beam 718 to impact onto blanking aperture (not shown) instead of substrate 722 when a blanking controller (not shown) applies a blanking voltage to the blanking electrode.

The liquid metal ion source 714 typically provides a metal ion beam of gallium. The source typically is capable of being focused into a sub one-tenth micrometer wide beam at substrate 722 for either modifying the substrate 722 by ion milling, enhanced etch, material deposition, or for the purpose of imaging the substrate 722.

A system controller 719 controls the operations of the various parts of dual beam system 710. Through system controller 719, a user can cause ion beam 718 or electron beam 743 to be scanned in a desired manner through commands entered into a conventional user interface (not shown). Alternatively, system controller 719 may control dual beam system 710 in accordance with programmed instructions.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

Although the description of the present invention above is mainly directed at methods for beam-induced deposition of low-resistivity material, it should be recognized that an apparatus performing the operation of such a method would further be within the scope of the present invention. Further, it should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

While the examples provided above describe the use of the present invention in circuit edit applications, the invention can be used in any application where there is a need for a precursor to deposit a low resistivity metal onto a substrate, or to deposit metal oxides or nitrides using the same precursor gas. Although much of the previous description is directed at semiconductor wafers or magnetic storage media, the invention could be applied to any suitable substrate or surface. The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

The term "integrated circuit" refers to a set of electronic components and their interconnections (internal electrical circuit elements, collectively) that are patterned on the surface of a microchip. The term "semiconductor" or "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale. Particle beam systems suitable for carrying out the present invention are commercially available, for example, from FEI Company, the assignee of the present application.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of depositing a low resistivity material onto a substrate, the method comprising:
   directing a precursor gas comprising a methylated or ethylated tin toward a surface of the substrate;
   irradiating the surface of the substrate with an ion beam in the presence of the precursor gas, the precursor gas dissociating in the presence of the ion beam to deposit a material on the surface of the substrate;
   wherein the deposited material contains tin dissociated from the precursor gas and has a resistivity of 50 $\mu\Omega \cdot cm$ or lower upon deposition.

2. The method of claim 1 in which the ion beam is a gallium ion beam and in which the deposited material contains gallium.

3. The method of claim 1 in which the precursor gas comprises hexamethylditin.

4. The method of claim 1 in which the precursor gas comprises methyl tin trichloride, hexaethylditin, or hexabutylditin.

5. The method of claim 1 in which the deposited material is Ohmic.

6. The method of claim 2 in which the deposited material has a resistivity within a factor of 5 of bulk tin.

7. The method of claim 3 in which the ion beam is a gallium ion beam, and in which the deposited material further comprises gallium.

8. The method of claim 7 in which the deposited material is at least 95% pure tin.

9. The method of claim 1 in which the ion beam comprises a gallium focused ion beam.

10. The method of claim 1 in which the ion beam comprises a focused ion beam produced using a plasma source.

11. The method of claim 10 in which the focused ion beam comprises ions of xenon, argon, or helium.

12. The method of claim 1 in which the ion beam is produced using a mass-selected ion source.

13. A method of depositing a low resistivity material onto a substrate the method comprising:
   directing a precursor gas comprising hexamethylditin toward a surface of the substrate; and
   irradiating the surface of the substrate with an ion beam in the presence of the precursor gas, the precursor gas reacting in the presence of the ion beam to deposit a material on the surface of the substrate, said deposited material containing tin and constituents of the ion beam and having a resistivity of less than 50 $\mu\Omega \cdot cm$.

14. The method of claim 13 in which the deposited material is at least 95% pure tin.

15. The method of claim 13 wherein;
   the ion beam is a gallium ion beam;
   the deposited material contains gallium.

16. A method of beam induced deposition:
   directing a precursor gas comprising a methylated or ethylated tin toward a surface of a substrate;

irradiation the surface of the substrate with a gallium ion beam in the presence of the precursor gas, the precursor gas reacting in the presence of the gallium ion beam to deposit a material on the surface of the substrate, wherein the deposited material comprises a eutectic composition or solid solution of gallium and tin dissociated from the precurosor and has a resistivity of 50 $\mu\Omega\cdot cm$.

17. The method of claim 16 in which the precursor gas comprises hexamethylditin.

18. The method of claim 16 in which the precursor gas comprises methyl tin trichloride, hexaethylditin, or hexabutylditin.

19. The method of claim 16 in which the precursor gas is mixed with a compound including oxygen to deposit a tin oxide on the surface of the substrate.

20. The method of claim 16 in which the precursor gas is mixed with a compound including nitrogen to deposit a tin nitride on the surface of the substrate.

21. The method of claim 13 in which the ion beam is a gallium ion beam and in which the deposited material comprises gallium.

* * * * *